US012633362B2

(12) United States Patent
Lien et al.

(10) Patent No.: US 12,633,362 B2
(45) Date of Patent: May 19, 2026

(54) CONFIGURABLE PROGRAM VERIFY LEVELS ACCORDING TO PROGRAM-ERASE CYCLES AT A MEMORY SYSTEM

(71) Applicant: Micron Technology, Inc., Boise, ID (US)

(72) Inventors: Yu-Chung Lien, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 122 days.

(21) Appl. No.: 18/789,364

(22) Filed: Jul. 30, 2024

(65) Prior Publication Data

US 2026/0038612 A1 Feb. 5, 2026

(51) Int. Cl.
*G11C 16/34* (2006.01)
*G11C 16/10* (2006.01)

(52) U.S. Cl.
CPC ........ *G11C 16/3459* (2013.01); *G11C 16/102* (2013.01); *G11C 16/349* (2013.01)

(58) Field of Classification Search
CPC .. G11C 16/3459; G11C 16/102; G11C 16/349

USPC ...................................................... 365/185.22
See application file for complete search history.

(56) References Cited

U.S. PATENT DOCUMENTS

| | | | | |
|---|---|---|---|---|
| 2023/0058038 A1* | 2/2023 | Zainuddin | ............ | G11C 16/349 |
| 2023/0170033 A1* | 6/2023 | Lee | ........................ | G11C 16/08 |
| | | | | 365/185.22 |
| 2024/0296891 A1* | 9/2024 | Wang | ..................... | G11C 16/08 |

* cited by examiner

*Primary Examiner* — Fernando Hidalgo
(74) *Attorney, Agent, or Firm* — Holland & Hart LLP

(57) ABSTRACT

Methods, systems, and devices for configurable program verify levels according to PECs at a memory system are described. The described techniques provide for a memory system to adjust a program verify offset magnitude when performing a program verify operation on a memory cell according to a program-erase cycle (PEC) count of the memory cell. For example, due to higher PEC counts being associated with relatively higher charge loss rates, the memory system may apply a relatively higher program verify offset to the memory cell when the PEC count of the memory cell is relatively high and may apply a relatively lower program verify offset to the memory cell when the PEC count of the memory cell is relatively low.

24 Claims, 6 Drawing Sheets

Figure 6:
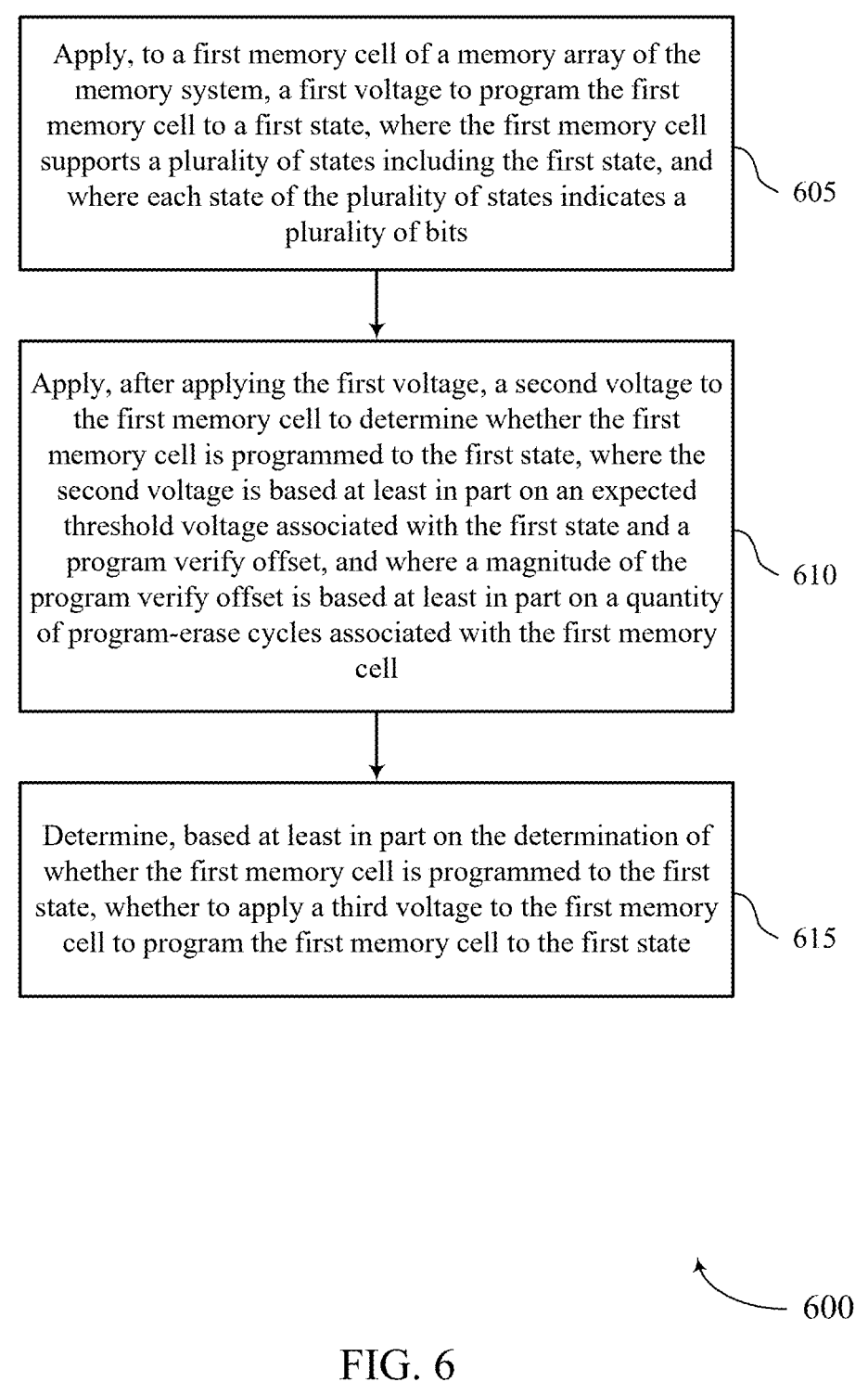

Apply, to a first memory cell of a memory array of the memory system, a first voltage to program the first memory cell to a first state, where the first memory cell supports a plurality of states including the first state, and where each state of the plurality of states indicates a plurality of bits

605

↓

Apply, after applying the first voltage, a second voltage to the first memory cell to determine whether the first memory cell is programmed to the first state, where the second voltage is based at least in part on an expected threshold voltage associated with the first state and a program verify offset, and where a magnitude of the program verify offset is based at least in part on a quantity of program-erase cycles associated with the first memory cell

610

↓

Determine, based at least in part on the determination of whether the first memory cell is programmed to the first state, whether to apply a third voltage to the first memory cell to program the first memory cell to the first state

CONFIGURABLE PROGRAM VERIFY LEVELS ACCORDING TO PROGRAM-ERASE CYCLES AT A MEMORY SYSTEM

TECHNICAL FIELD

The following relates to one or more systems for memory, including configurable program verify levels according to program-erase cycles (PECs) at a memory system.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

BRIEF DESCRIPTION OF THE DRAWINGS

FIG. 6 shows a flowchart illustrating a method or methods that support configurable program verify levels according to PECs at a memory system in accordance with examples as disclosed herein.

DETAILED DESCRIPTION

Figure 1:
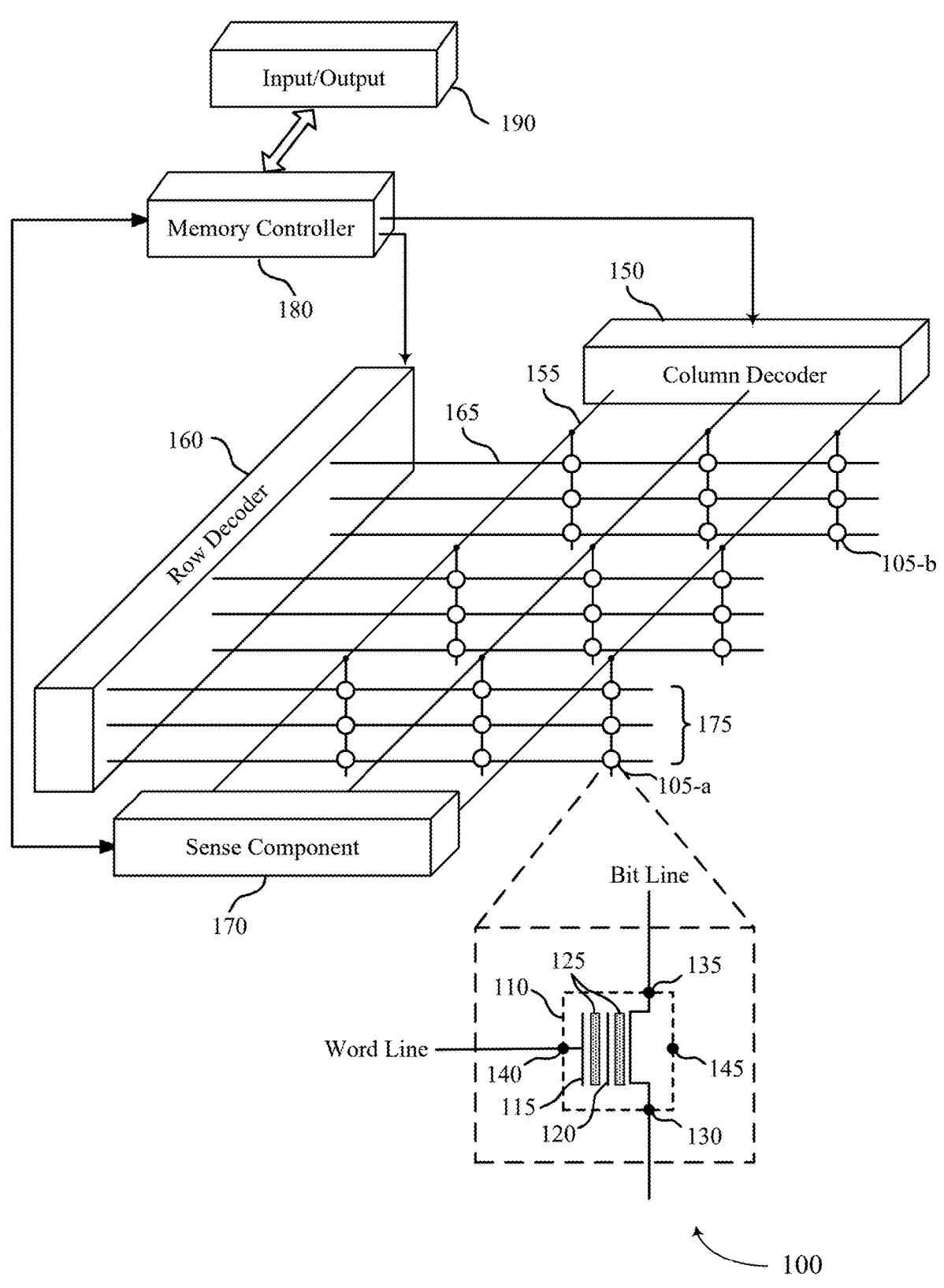
FIG. 1 shows an example of a memory device that supports configurable program verify levels according to program-erase cycles (PECs) at a memory system in accordance with examples as disclosed herein.

Memory systems may be provided in accordance with various configurations that support maintaining information in memory cells. In some configurations, a memory system may program one or more memory cells to store information by applying a programming voltage (e.g., a write voltage) to the memory cells. In some cases, as part of a programming operation, the memory system may perform a program verification to determine whether a memory cell has been successfully programmed. For example, the memory system may apply a programming voltage to a memory cell to program the memory cell to a first state and may apply a program verify voltage (e.g., similar to a read voltage, performed during the programming operation) to the memory cell to determine whether the memory cell was successfully programmed to the first state (e.g., whether the memory cell outputs a value corresponding to the first state in response to the program verify voltage). Such techniques may be applicable to memory cells capable of storing multiple bits of information, such as multi-level cells (MLCs), tri-level cells (TLCs), quad-level cells (QLCs), or the like. In some examples, after programming a first memory cell, the memory system may program a second memory cell that is proximate to the first memory cell (e.g., a neighboring memory cell, memory cells adjacent within the memory system). For example, the memory system may program a first word line including the first memory cell and may program a second word line including the second memory cell. In some cases, programming the second memory cell may shift a charge of the first memory cell, which may change an effective threshold voltage of the first memory cell and a value obtained when reading the first memory cell.

In some examples, the memory system may leverage knowledge of the state that the second memory cell will be programmed to prior to programming the second memory cell (e.g., if the data being programmed is part of a flushing operation) to determine a program verify offset to apply to the program verify voltage for the first memory cell. For example, if the memory system is aware that the second memory cell will be programmed to a state associated with a lower charge than a state of the first memory cell, the memory system may expect relatively high charge loss from the first memory cell after programming the second memory cell (e.g., charge may flow towards the second memory cell due to electric equilibrium). The memory system may determine to offset (e.g., increase) the program verify voltage when performing the verification of the first memory cell, which may allow for the memory system to account, in advance, for charge loss incurred by programming neighboring cells (e.g., the program verify offset may result in additional charge storage at the first memory cell). In some cases, other factors may influence the charge of the memory cell, such as a quantity of program-erase cycles (PECs) at the memory cell, where memory cells associated with relatively high PEC counts may experience relatively greater charge loss. However, the memory system may not consider such factors when determining a program verify voltage to apply to the memory cell, which may limit performance of program verify operations, subsequent read operations, subsequent write operations, or any combination thereof.

In accordance with examples as described herein, a memory system may adjust a program verify offset magnitude for performing a program verify on a memory cell according to a PEC count of the memory cell. For example, due to higher PEC counts being associated with different (e.g., higher) charge loss rates than lower PEC counts, the memory system may apply a different program verify offset to the memory cell when the PEC count of the memory cell is relatively high as compared to when the PEC count of the memory cell is relatively low. For example, depending on memory cell type or other considerations, a relatively higher program verify offset may be used when the PEC count of the memory cell is relatively high and a relatively lower verify offset may be used when the PEC count of the memory cell is relatively lower, or vice versa. By adjusting the program verify offset value according to the PEC count of a memory cell, the memory system may improve performance of programming operations, subsequent read operations, a read window budget (RWB) of the memory cell, or any combination thereof.

In addition to applicability in memory systems as described herein, techniques for configurable program verify levels according to PECs may be generally implemented to improve the performance of various electronic devices and systems (including artificial intelligence (AI) applications, augmented reality (AR) applications, virtual reality (VR) applications, and gaming). Some electronic device applications, including high-performance applications such as AI, AR, VR, and gaming, may be associated with relatively high processing requirements to satisfy user expectations. As such, increasing processing capabilities of the electronic devices by decreasing response times, improving power consumption, reducing complexity, increasing data throughput or access speeds, decreasing communication times, or increasing memory capacity or density, among other performance indicators, may improve user experience or appeal. Implementing the techniques described herein may improve the performance of electronic devices by improving memory programming operations and program verify operations, which may decrease processing or latency times, reduce power expenditure, or otherwise improve user experience, among other benefits.

Features of the disclosure are illustrated and described in the context of systems, devices, and circuits. Features of the disclosure are further illustrated and described in the context of programming schemes, a program verify offset scheme, and flowcharts.

FIG. 1 shows an example of a memory device 100 that supports configurable program verify levels according to PECs at a memory system in accordance with examples as disclosed herein. FIG. 1 is an illustrative representation of various components and features of the memory device 100. As such, the components and features of the memory device 100 are shown to illustrate functional interrelationships, and not necessarily physical positions within the memory device 100. Further, although some elements included in FIG. 1 are labeled with a numeric indicator, some other corresponding elements are not labeled, even though they are the same or would be understood to be similar, in an effort to increase visibility and clarity of the depicted features. A memory system as described herein may be or include one memory device (e.g., a memory device 100) or multiple memory devices (e.g., multiple memory devices 100), possibly along with one or more other components.

The memory device 100 may include one or more memory cells 105, such as memory cell 105-a and memory cell 105-b. In some examples, a memory cell 105 may be a NAND memory cell, such as in the blow-up diagram of memory cell 105-a. Each memory cell 105 may be programmed to store a logic value representing one or more bits of information. In some examples, a single memory cell 105—such as a memory cell 105 configured as a single-level cell (SLC)—may be programmed to one of two supported states and thus may store one bit of information at a time (e.g., a logic 0 or a logic 1). In some other examples, a single memory cell 105—such a memory cell 105 configured as a MLC, a TLC, a QLC, or other type of multiple-level memory cell 105—may be programmed to one state of more than two supported states and thus may store more than one bit of information at a time. In some cases, a multiple-level memory cell 105 (e.g., an MLC memory cell, a TLC memory cell, a QLC memory cell) may be physically different than an SLC cell. For example, a multiple-level memory cell 105 may use a different cell geometry or may be fabricated using different materials. In some examples, a multiple-level memory cell 105 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

In some NAND memory arrays, each memory cell 105 may be illustrated as a transistor that includes a charge trapping structure (e.g., a floating gate, a replacement gate, a dielectric material) for storing an amount of charge representative of a logic value. For example, the blow-up in FIG. 1 illustrates a NAND memory cell 105-a that includes a transistor 110 (e.g., a metal-oxide-semiconductor (MOS) transistor) that may be used to store a logic value. The transistor 110 may include a control gate 115 and a charge trapping structure 120 (e.g., a floating gate, a replacement gate), where the charge trapping structure 120 may, in some examples, be between two portions of dielectric material 125. The transistor 110 also may include a first node 130 (e.g., a source or drain) and a second node 135 (e.g., a drain or source). A logic value may be stored in transistor 110 by storing (e.g., writing) a quantity of electrons (e.g., an amount of charge) on the charge trapping structure 120. An amount of charge to be stored on the charge trapping structure 120 may depend on the logic value to be stored. The charge stored on the charge trapping structure 120 may affect the threshold voltage of the transistor 110, thereby affecting the amount of current that flows through the transistor 110 when the transistor 110 is activated (e.g., when a voltage is applied to the control gate 115, when the memory cell 105-a is read). In some examples, the charge trapping structure 120 may be an example of a floating gate or a replacement gate that may be part of a 2D NAND structure. For example, a 2D NAND array may include multiple control gates 115 and charge trapping structures 120 arranged around a single channel (e.g., a horizontal channel, a vertical channel, a columnar channel, a pillar channel).

A logic value stored in the transistor 110 may be sensed (e.g., as part of a read operation) by applying a voltage to the control gate 115 (e.g., to control node 140, via a word line 165) to activate the transistor 110 and measuring (e.g., detecting, sensing) an amount of current that flows through the first node 130 or the second node 135 (e.g., via a bit line 155). For example, a sense component 170 may determine whether an SLC memory cell 105 stores a logic 0 or a logic 1 in a binary manner (e.g., based on a presence or absence of a current through the memory cell 105 when a read voltage is applied to the control gate 115, based on whether the current is above or below a threshold current). For a multiple-level memory cell 105, a sense component 170 may determine a logic value stored in the memory cell 105 based on various intermediate threshold levels of current when a read voltage is applied to the control gate 115, or by applying different read voltages to the control gate and evaluating different resulting levels of current through the transistor 110, or various combinations thereof. In one example of a multiple-level architecture, a sense component 170 may determine the logic value of a TLC memory cell 105 based on eight different levels of current, or ranges of current, that define the eight potential logic values that could be stored by the TLC memory cell 105.

An SLC memory cell 105 may be written by applying one of two voltages (e.g., a voltage above a threshold or a voltage below a threshold) to the memory cell 105 to store, or not store, an electric charge on the charge trapping structure 120 and thereby cause the memory cell 105 to store one of two possible logic values. For example, when a first voltage is applied to the control node 140 (e.g., via a word line 165) relative to a bulk node 145 (e.g., a body node) for the transistor 110 (e.g., when the control node 140 is at a higher voltage than the bulk), electrons may tunnel into the charge trapping structure 120. Injection of electrons into the charge trapping structure 120 may be referred to as programming the memory cell 105 and may occur as part of a write operation. A programmed memory cell may, in some cases, be considered as storing a logic 0. When a second voltage is applied to the control node 140 (e.g., via the word line 165) relative to the bulk node 145 for the transistor 110 (e.g., when the control node 140 is at a lower voltage than the bulk node 145), electrons may leave the charge trapping structure 120. Removal of electrons from the charge trapping structure 120 may be referred to as erasing the memory cell 105 and may occur as part of an erase operation. An erased memory cell may, in some cases, be considered as storing a logic 1. In some cases, memory cells 105 may be programmed at a page level of granularity due to memory cells 105 of a page sharing a common word line 165, and memory cells 105 may be erased at a block level of granularity due to memory cells 105 of a block sharing commonly biased bulk nodes 145.

In contrast to writing an SLC memory cell 105, writing a multiple-level (e.g., MLC, TLC, or QLC) memory cell 105 may involve applying different voltages to the memory cell 105 (e.g., to the control node 140 or bulk node 145 thereof) at a finer level of granularity to more finely control the amount of charge stored on the charge trapping structure 120, thereby enabling a larger set of logic values to be represented. Thus, multiple-level memory cells 105 may provide greater density of storage relative to SLC memory cells 105 but may, in some cases, involve narrower read or write margins or greater complexities for supporting circuitry.

A charge-trapping NAND memory cell 105 may operate similarly to a floating-gate NAND memory cell 105 but, instead of or in addition to storing a charge on a charge trapping structure 120, a charge-trapping NAND memory cell 105 may store a charge representing a logic state in a dielectric material between the control gate 115 and a channel (e.g., a channel between a first node 130 and a second node 135). Thus, a charge-trapping NAND memory cell 105 may include a charge trapping structure 120, or may implement charge trapping functionality in one or more portions of dielectric material 125, among other configurations.

In some examples, each page of memory cells 105 may be connected to a corresponding word line 165, and each column of memory cells 105 may be connected to a corresponding bit line 155 (e.g., digit line). Thus, one memory cell 105 may be located at the intersection of a word line 165 and a bit line 155. This intersection may be referred to as an address of a memory cell 105. In some cases, word lines 165 and bit lines 155 may be substantially perpendicular to one another, and may be generically referred to as access lines or select lines.

In some cases, a memory device 100 may include a three-dimensional (3D) memory array, where multiple two-dimensional (2D) memory arrays may be formed on top of one another. In some examples, such an arrangement may increase the quantity of memory cells 105 that may be fabricated on a single die or substrate as compared with 1D arrays, which, in turn, may reduce production costs, or increase the performance of the memory array, or both. In the example of FIG. 1, memory device 100 includes multiple levels (e.g., decks, layers, planes, tiers) of memory cells 105. The levels may, in some examples, be separated by an electrically insulating material. Each level may be aligned or positioned so that memory cells 105 may be aligned (e.g., exactly aligned, overlapping, or approximately aligned) with one another across each level, forming a memory cell stack 175. In some cases, memory cells aligned along a memory cell stack 175 may be referred to as a string of memory cells 105 (e.g., as described with reference to FIG. 2).

Accessing memory cells 105 may be controlled through a row decoder 160 and a column decoder 150. For example, the row decoder 160 may receive a row address from the memory controller 180 and activate an appropriate word line 165 based on the received row address. Similarly, the column decoder 150 may receive a column address from the memory controller 180 and activate an appropriate bit line 155. Thus, by activating one word line 165 and one bit line 155, one memory cell 105 may be accessed. As part of such accessing, a memory cell 105 may be read (e.g., sensed) by sense component 170. For example, the sense component 170 may be configured to determine the stored logic value of a memory cell 105 based on a signal generated by accessing the memory cell 105. The signal may include a current, a voltage, or both a current and a voltage on the bit line 155 for the memory cell 105 and may depend on the logic value stored by the memory cell 105. The sense component 170 may include various circuitry (e.g., transistors, amplifiers) configured to detect and amplify a signal (e.g., a current or voltage) on a bit line 155. The logic value of memory cell 105 as detected by the sense component 170 may be output via input/output component 190. In some cases, a sense component 170 may be a part of a column decoder 150 or a row decoder 160, or a sense component 170 may otherwise be connected to or in electronic communication with a column decoder 150 or a row decoder 160.

A memory cell 105 may be programmed or written by activating the relevant word line 165 and bit line 155 to enable a logic value (e.g., representing one or more bits of information) to be stored in the memory cell 105. A column decoder 150 or a row decoder 160 may accept data (e.g., from the input/output component 190) to be written to the memory cells 105. In the case of NAND memory, a memory cell 105 may be written by storing electrons in a charge trapping structure or an insulating layer.

A memory controller 180 may control the operation (e.g., read, write, re-write, refresh) of memory cells 105 through the various components (e.g., row decoder 160, column decoder 150, sense component 170). In some cases, one or more of a row decoder 160, a column decoder 150, and a sense component 170 may be co-located with a memory controller 180. A memory controller 180 may generate row and column address signals in order to activate a desired word line 165 and bit line 155. In some examples, a memory controller 180 may generate and control various voltages or currents used during the operation of memory device 100.

A memory system (e.g., including a memory device 100) may program one or more memory cells 105 to store information by applying a programming voltage (e.g., a write voltage) to the memory cells 105. In some cases, as part of a programming operation, the memory system may perform a program verification to determine whether a memory cell 105 has been successfully programmed. For example, the memory system may apply a programming voltage to a memory cell 105 to program the memory cell to a first state and may apply a program verify voltage (e.g., similar to a read voltage, performed during the programming operation) to the memory cell 105 to determine whether the memory cell 105 was successfully programmed to the first state (e.g., whether the memory cell 105 outputs a value corresponding to the first state in response to the program verify voltage). Such techniques may be applicable to memory cells 105 capable of storing multiple bits of information, such as MLCs, TLCs, QLCs, or the like. In some examples, after programming a first memory cell 105, the memory system may program a second memory cell 105 that is proximate to the first memory cell 105 (e.g., a neighboring memory cell 105, memory cells 105 adjacent within the memory system). For example, the memory system may program a first word line 165 including the first memory cell 105 and may program a second word line 165 including the second memory cell 105. In some cases, programming the second memory cell 105 may shift a charge of the first memory cell 105, which may change an effective threshold voltage of the first memory cell 105 and a value obtained when reading the first memory cell 105.

In some examples, the memory system may leverage knowledge of the state that the second memory cell 105 will be programmed to prior to programming the second memory cell 105 (e.g., if the data being programmed is part of a flushing operation) to determine a program verify offset to apply to the program verify voltage for the first memory cell 105. For example, if the memory system is aware that the second memory cell 105 will be programmed to a state associated with a lower charge than a state of the first memory cell 105, the memory system may expect relatively high charge loss from the first memory cell 105 after programming the second memory cell 105 (e.g., charge may flow towards the second memory cell 105 due to electric equilibrium). The memory system may determine to offset (e.g., increase) the program verify voltage when performing the verification of the first memory cell 105, which may allow for the memory system to account, in advance, for charge loss incurred after programming neighboring cells 105 (e.g., the program verify offset may result in additional charge storage at the first memory cell 105). In some cases, other factors may influence the charge of the memory cell 105, such as a quantity of PECs at the memory cell 105, where memory cells 105 associated with relatively high PEC counts may experience relatively greater charge loss. However, the memory system may not consider such factors when determining a program verify voltage to apply to the memory cell 105, which may limit performance of program verify operations, subsequent read operations, subsequent write operations, or any combination thereof.

In accordance with examples as described herein, a memory system may adjust a program verify offset magnitude for performing a program verify on a memory cell 105 according to a PEC count of the memory cell 105. For example, due to higher PEC counts being associated with relatively higher charge loss rates, the memory system may apply a relatively higher program verify offset to the memory cell 105 when the PEC count of the memory cell 105 is relatively high and may apply a relatively lower program verify offset to the memory cell 105 when the PEC count of the memory cell 105 is relatively low. By adjusting the program verify offset value according to the PEC count of a memory cell 105, the memory system may improve performance of programming operations, subsequent read operations, a RWB of the memory cell 105, or any combination thereof.

Figure 2:
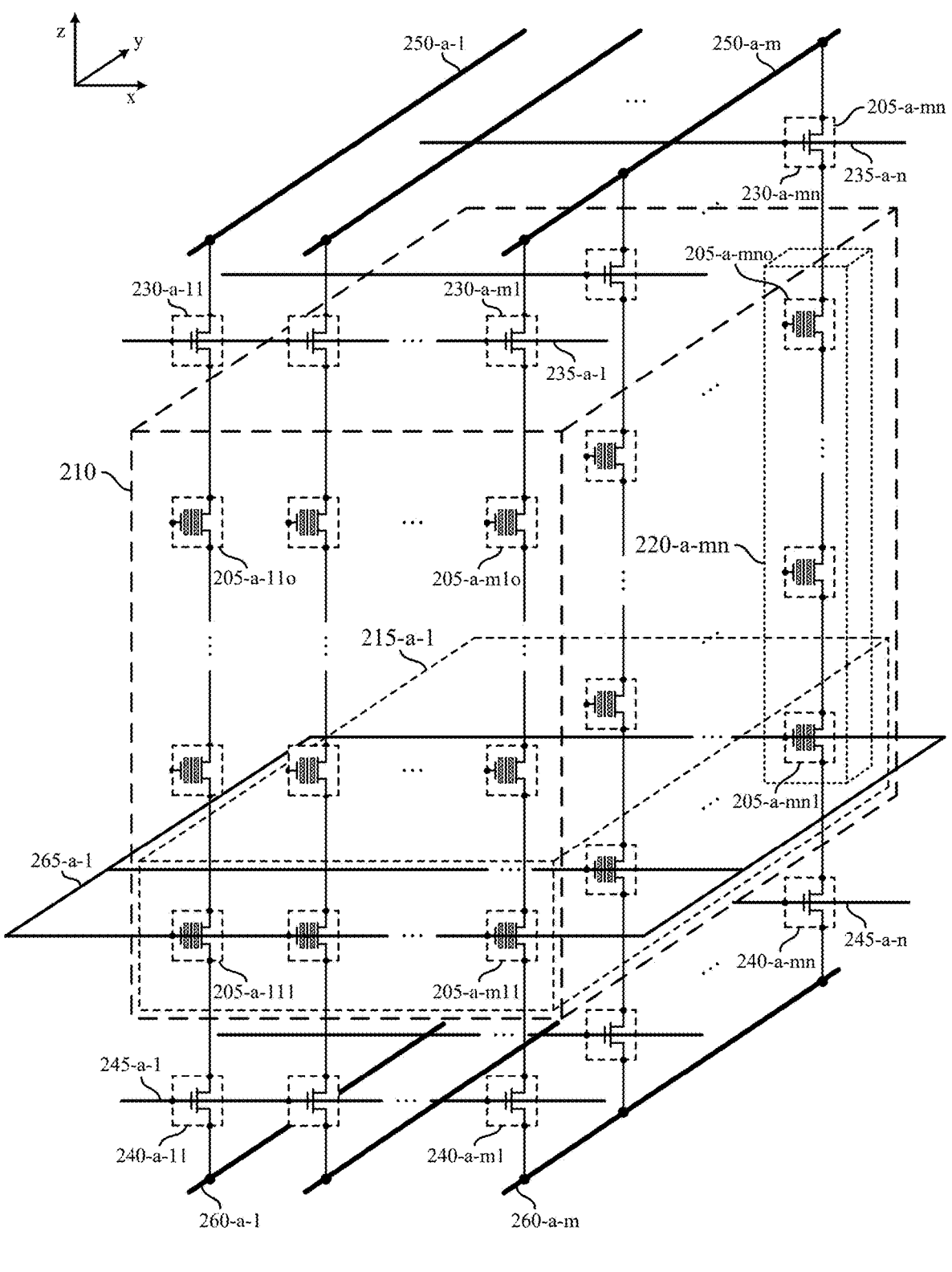
FIG. 2 shows an example of a memory architecture that supports configurable program verify levels according to PECs at a memory system in accordance with examples as disclosed herein.

FIG. 2 shows an example of a memory architecture 200 that supports configurable program verify levels according to PECs at a memory system in accordance with examples as disclosed herein. The memory architecture 200 may be an example of a portion of a memory device, such as a memory device 100. Although some elements of a set of elements (e.g., an array of elements) are included in FIG. 2, some elements may be omitted for the sake of visibility and clarity of the depicted elements. Moreover, although some elements included in FIG. 2 are labeled with reference numbers, some other corresponding elements are not labeled, though they would be understood by a person having ordinary skill in the art to be the same as or similar to the labeled elements. Aspects of the memory architecture 200 may be described with reference to an x-direction, a y-direction, and a z-direction of the illustrated coordinate system.

The memory architecture 200 includes a three-dimensional array of memory cells 205, which may be examples of memory cells 105 described with reference to FIG. 1 (e.g., transistors 110, NAND memory cells). In some examples, the memory cells 205 may be connected in a 3D NAND configuration. For example, the memory cells 205 may be included in a block 210, which may be arranged as a 3D array of m memory cells along the x-direction, n memory cells along the y-direction, and o memory cells along the z-direction. Each memory cell 205 may be located (e.g., addressed) in accordance with an index i along the x-direction, an index j along the y-direction, and an index k along the z-direction (e.g., for locating a memory cell 205-a-ijk). A memory device 100 may include any quantity of one or more blocks 210 in accordance with examples as disclosed herein, and different blocks 210 may be adjacent along the x-direction, along the y-direction, or along the z-direction, or any combination thereof.

In the example of memory architecture 200, the block 210 may be divided into a set of pages 215 (e.g., a quantity of pages 215) along the z-direction, including a page 215-a-1 associated with memory cells 205-a-111 through 205-a-mn1. In some examples, each page 215 may be associated with the same word line 265, (e.g., a word line 165 described with reference to FIG. 1), which may be coupled with a control gate 115 of each of the memory cells 205 of the page 215. For example, page 215-a-1 may be associated with a word line 265-a-1, and other pages 215-a-i may be associated with a different respective word line 265-a-i (not shown). In some examples, a word line 265 in accordance with the memory architecture 200 may be implemented as planar conductor (e.g., in an xy-plane) that is coupled with each of the memory cells 205 of the page 215.

In the example of memory architecture 200, the block 210 also may be divided into a set of strings 220 (e.g., a quantity of (m×n) strings 220) in an xy-plane, including a string 220-a-mn associated with memory cells 205-a-mn1 through 205-a-mno. In some examples, each string 220 may include a set of memory cells 205 connected in series (e.g., along the z-direction, in which a drain of one memory cell 205 in the string 220 may be coupled with a source of another memory cell 205 in the string 220). In some examples, memory cells 205 of a string 220 may be implemented along a common channel, such as a pillar channel (e.g., a columnar channel, a pillar of doped semiconductor) along the z-direction. Each memory cell 205 in a string 220 may be associated with a different word line 265, such that a quantity of word lines 265 in the memory architecture 200 may be equal to the quantity of memory cells 205 in a string 220. Accordingly, a string 220 may include memory cells 205 from multiple pages 215, and a page 215 may include memory cells 205 from multiple strings 220.

In some examples, memory cells 205 may be pro-grammed (e.g., set to a logic 0 value) and read from in accordance with a granularity, such as at the granularity of a page 215 or portion thereof, but may not be erasable (e.g., reset to a logic 1 value) in accordance with the granularity, such as the granularity of a page 215 or portion thereof. For example, NAND memory may instead be erasable in accor-dance with a different (e.g., higher) level of granularity, such as at the level of granularity the block 210. In some cases, a memory cell 205 may be erased before it may be re-programmed. Different memory devices may have different read, write, or erase characteristics.

In some examples, each string 220 of a block 210 may be coupled with a respective transistor 230 (e.g., a string select transistor, a drain select transistor) at one end of the string 220 (e.g., along the z-direction) and a respective transistor 240 (e.g., a source select transistor, a ground select transis-tor) at the other end of the string 220. In some examples, a drain of each transistor 230 may be coupled with a bit line 250 of a set of bit lines 250 associated with the block 210, where the bit lines 250 may be examples of bit lines 155 described with reference to FIG. 1. A gate of each transistor 230 may be coupled with a select line 235 (e.g., a string select line, a drain select line). Thus, a transistor 230 may be used to couple a string 220 with a bit line 250 based on applying a voltage to the select line 235, and thus to the gate of the transistor 230. Although illustrated as separate lines along the x-direction, in some examples, select lines 235 may be common to all the transistors 230 associated with the block 210 (e.g., a commonly biased string select node). For example, like the word lines 265 of the block 210, select lines 235 associated with the block 210 may, in some examples, be implemented as a planar conductor (e.g., in an xy-plane) that is coupled with each of the transistors 230 associated with the block 210.

In some examples, a source of each transistor 240 asso-ciated with the block 210 may be coupled with a source line 260 of a set of source lines 260 associated with the block 210. In some examples, the set of source lines 260 may be associated with a common source node (e.g., a ground node) corresponding to the block 210. A gate of each transistor 240 may be coupled with a select line 245 (e.g., a source select line, a ground select line). Thus, a transistor 240 may be used to couple a string 220 with a source line 260 based on applying a voltage to the select line 245, and thus to the gate of the transistor 240. Although illustrated as separate lines along the x-direction, in some examples, select lines 245 also may be common to all the transistors 240 associated with the block 210 (e.g., a commonly biased ground select node). For example, like the word lines 265 of the block 210, select lines 245 associated with the block 210 may, in some examples, be implemented as a planar conductor (e.g., in an xy-plane) that is coupled with each of the transistors 240 associated with the block 210.

To operate the memory architecture 200 (e.g., to perform a program operation, a read operation, or an erase operation on one or more memory cells 205 of the block 210), various voltages may be applied to one or more select lines 235 (e.g., to the gate of the transistors 230), to one or more bit lines 250 (e.g., to the drain of one or more transistors 230), to one or more word lines 265, to one or more select lines 245 (e.g., to the gate of the transistors 240), to one or more source lines 260 (e.g., to the source of the transistors 240), or to a bulk for the memory cells 205 (not shown) of the block 210. In some cases, each memory cell 205 of a block 210 may have a common bulk, the voltage of which may be controlled independently of bulks for other blocks 210.

In some cases, as part of a read operation for a memory cell 205, a positive voltage may be applied to the corre-sponding bit line 250 while the corresponding source line 260 may be grounded or otherwise biased at a voltage lower than the voltage applied to the bit line 250. In some examples, voltages may be concurrently applied to the select line 235 and the select line 245 that are above the threshold voltages of the transistor 230 and the transistor 240, respec-tively, for the memory cell 205, thereby activating the transistor 230 and transistor 240 such that a channel asso-ciated with the string 220 that includes the memory cell 205 (e.g., a pillar channel) may be electrically connected with (e.g., electrically connected between) the corresponding bit line 250 and source line 260. A channel may be an electrical path through the memory cells 205 in the string 220 (e.g., through the sources and drains of the transistors in the memory cells 205 of the string 220) that may conduct current under some operating conditions.

In some examples, multiple word lines 265 (e.g., in some cases all word lines 265) of the block 210—except a word line 265 associated with a page 215 of the memory cell 205 to be read—may concurrently be set to a voltage (e.g., VREAD) that is higher than the threshold voltage (VT) of the memory cells 205. VREAD may cause all memory cells 205 in the unselected pages 215 be activated so that each unselected memory cell 205 in the string 220 may maintain high conductivity within the channel. In some examples, the word line 265 associated with the memory cell 205 to be read may be set to a voltage, VTarget. Where the memory cells 205 are operated as SLC memory cells, VTarget may be a voltage that is between (i) VT of a memory cell 205 in an erased state and (ii) VT of a memory cell 205 in a programmed state.

When the memory cell 205 to be read exhibits an erased VT (e.g., VTarget>VT of the memory cell 205), the memory cell 205 may turn "ON" in response to the application of VTarget to the word line 265 of the selected page 215, which may allow a current to flow in the channel of the string 220, and thus from the bit line 250 to the source line 260. When the memory cell 205 to be read exhibits a programmed VT (e.g., VTarget<VT of the selected memory cell), the memory cell 205 may remain "OFF" despite the application of VTarget to the word line 265 of the selected page 215, and thus may prevent a current from flowing in the channel of the string 220, and thus from the bit line 250 to the source line 260.

A signal on the bit line 250 for the memory cell 205 (e.g., an amount of current below or above a threshold) may be sensed (e.g., by a sense component 170 as described with reference to FIG. 1), and may indicate whether the memory cell 205 became conductive or remained non-conductive in response to the application of VTarget to the word line 265 of the selected page 215. The sensed signal thus may be indicative of whether the memory cell 205 was in an erased state (e.g., storing a logic 1) or a programmed state (e.g., storing a logic 0). Though aspects of the example read operation above have been explained in the context of an SLC memory cell 205 for clarity, such techniques may be extended or altered and applied in the context of a multiple-level memory cell 205 (e.g., through the use of multiple values of VTarget corresponding to the different amounts of charge that may be stored in one multiple-level memory cell 205).

In some cases, as part of a program operation for a memory cell 205, charge may be added to a portion of the memory cell 205 such that current flow through the memory cell 205, and thus the corresponding string 220, may be inhibited when the memory cell 205 is later read. For example, charge may be injected into a charge trapping structure 120 as shown in memory cell 105-a of FIG. 1. In some cases, respective voltages may be applied to the word line 265 of the page 215 and the bulk of the memory cell 205 to be programmed such that a control gate 115 of the memory cell 205 is at a higher voltage than the bulk of the memory cell 205 (e.g., a positive voltage may be applied to the word line). Concurrently, voltages may be applied to the select line 235 and the select line 245 that are above the threshold voltages of the transistor 230 and the transistor 240, respectively, thereby activating the transistor 230 and the transistor 240, and the bit line 250 for the memory cell 205 to be programmed may be set to a relatively high voltage. This may cause an electric field such that electrons are pulled from the source of the memory cell 205 towards the drain. The electric field may also cause some of these electrons to be pulled through dielectric material 125 and thereby injected into the charge trapping structure 120 of the memory cell 205, through a process which may in some cases be referred to as tunnel injection.

In some cases, a single program operation may program some or all memory cells 205 in a page 215, as the memory cells 205 of the page 215 may all share a common word line 265 and a common bulk. For a memory cell 205 of the page 215 for which it is not desired to write a logic 0 (e.g., not desired to program the memory cell 205), the corresponding bit line 250 may be set to a relatively low voltage (e.g., ground), which may facilitate the injection of electrons into a charge trapping structure 120. Though aspects of the example program operation above have been explained in the context of an SLC memory cell 205 for clarity, such techniques may be extended and applied to the context of a multiple-level memory cell 205 (e.g., through the use of multiple programming voltages applied to the word line 265, or multiple passes or pulses of a programming voltage applied to the word line 265, corresponding to the different amounts of charge that may be stored in one multiple-level memory cell 205).

In some cases, as part of an erase operation for a memory cell 205, charge may be removed from a portion of the memory cell 205 such that current flow through the memory cell 205, and thus the corresponding string 220, may be uninhibited (e.g., allowed, at least to a greater extent) when the memory cell 205 is later read. For example, charge may be removed from a charge trapping structure 120 as shown in memory cell 105-a of FIG. 1. In some cases, respective voltages may be applied to the word line 265 of the page 215 and the bulk of the memory cell 205 to be erased such that a control gate 115 of the memory cell 205 is at a lower voltage than the bulk of the memory cell 205 (e.g., a positive voltage may be applied to the bulk), which may cause an electric field that pulls electrons out of the charge trapping structure 120 and into the bulk of the memory cell 205. In some cases, a single program operation may erase all memory cells 205 in a block 210, as the memory cells 205 of the block 210 may all share a common bulk.

In some cases, electron injection and removal processes associated with program and erase operations may cause stress on a memory cell 205 (e.g., on the dielectric material 125). Over time, such stress may in some cases cause one or more aspects of the memory cell 205 (e.g., the dielectric material 125) to deteriorate. For example, charge trapping structure 120 may become unable to maintain a stored charge. Such deterioration may be an example of a wearout mechanism for a memory cell 205, and for this or other reasons, some memory cells 205 may support a finite quantity of program and erase cycles.

A memory system (e.g., including the memory architecture 200) may program one or more memory cells 205 to store information by applying a programming voltage (e.g., a write voltage) to the memory cells 205. In some cases, as part of a programming operation, the memory system may perform a program verification to determine whether a memory cell 205 has been successfully programmed. For example, the memory system may apply a programming voltage to a memory cell 205 to program the memory cell to a first state and may apply a program verify voltage (e.g., similar to a read voltage, performed during the programming operation) to the memory cell 205 to determine whether the memory cell 205 was successfully programmed to the first state (e.g., whether the memory cell 205 outputs a value corresponding to the first state in response to the program verify voltage). Such techniques may be applicable to memory cells 205 capable of storing multiple bits of information, such as MLCs, TLCs, QLCs, or the like. In some examples, after programming a first memory cell 205, the memory system may program a second memory cell 205 that is proximate to the first memory cell 205 (e.g., a neighboring memory cell 205, memory cells 205 adjacent within the memory system). For example, the memory system may program a first word line 265 including the first memory cell 205 and may program a second word line 265 including the second memory cell 205. In some cases, programming the second memory cell 205 may shift a charge of the first memory cell 205, which may change an effective threshold voltage of the first memory cell 205 and a value obtained when reading the first memory cell 205.

In some examples, the memory system may leverage knowledge of the state that the second memory cell 205 will be programmed to prior to programming the second memory cell 205 (e.g., if the data being programmed is part of a flushing operation) to determine a program verify offset to apply to the program verify voltage for the first memory cell 205. For example, if the memory system is aware that the second memory cell 205 will be programmed to a state associated with a lower charge than a state of the first memory cell 205, the memory system may expect relatively high charge loss from the first memory cell 205 after programming the second memory cell 205 (e.g., charge may flow towards the second memory cell 205 due to electric equilibrium). The memory system may determine to offset (e.g., increase) the program verify voltage when performing the verification of the first memory cell 205, which may allow for the memory system to account, in advance, for charge loss incurred after programming neighboring cells 205 (e.g., the program verify offset may result in additional charge storage at the first memory cell 205). In some cases, other factors may influence the charge of the memory cell 205, such as a quantity of PECs at the memory cell 205, where memory cells 205 associated with relatively high PEC counts may experience relatively greater charge loss. However, the memory system may not consider such factors when determining a program verify voltage to apply to the memory cell 205, which may limit performance of program verify operations, subsequent read operations, subsequent write operations, or any combination thereof.

In accordance with examples as described herein, a memory system may adjust a program verify offset magnitude for performing a program verify on a memory cell 205 according to a PEC count of the memory cell 205. For example, due to higher PEC counts being associated with relatively higher charge loss rates, the memory system may apply a relatively higher program verify offset to the memory cell 205 when the PEC count of the memory cell 205 is relatively high and may apply a relatively lower program verify offset to the memory cell 205 when the PEC count of the memory cell 205 is relatively low. By adjusting the program verify offset value according to the PEC count of a memory cell 205, the memory system may improve performance of programming operations, subsequent read operations, a RWB of the memory cell 205, or any combination thereof.

Figure 3A:
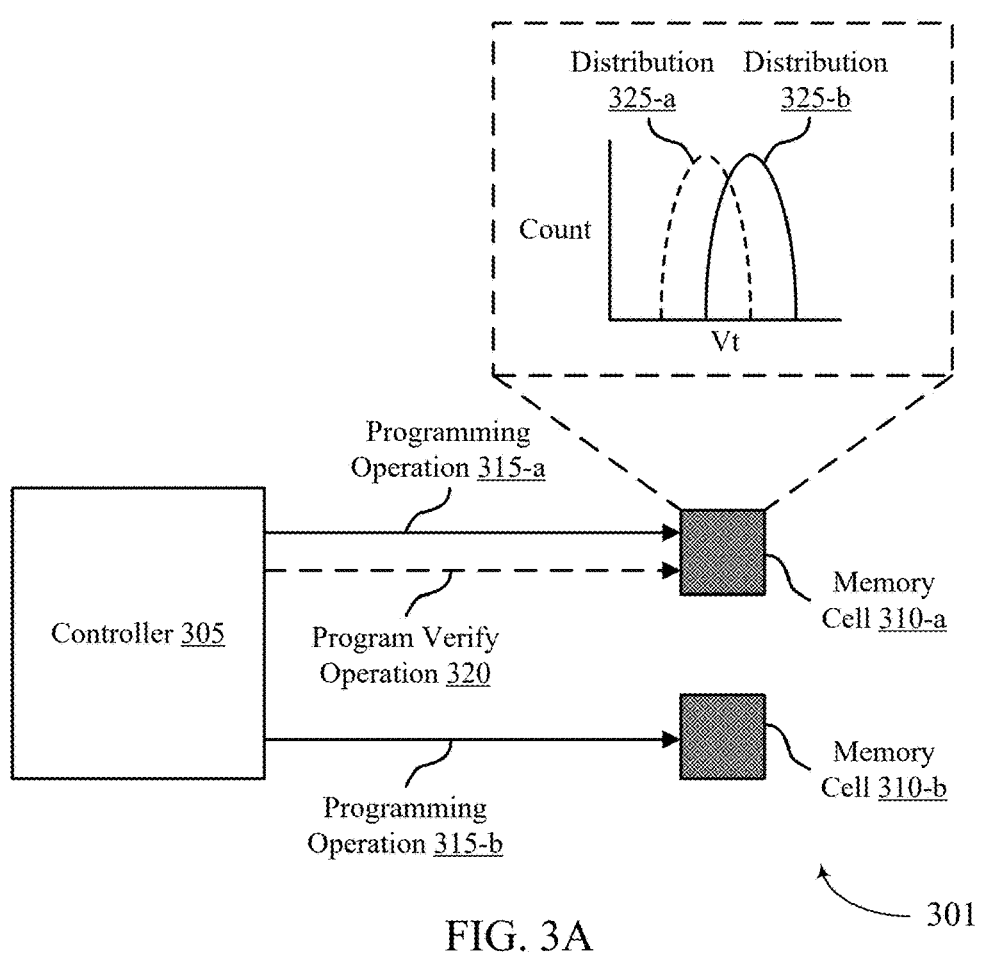
FIGS. 3A and 3B show examples of programming schemes that support configurable program verify levels according to PECs at a memory system in accordance with examples as disclosed herein.
Figure 3B:
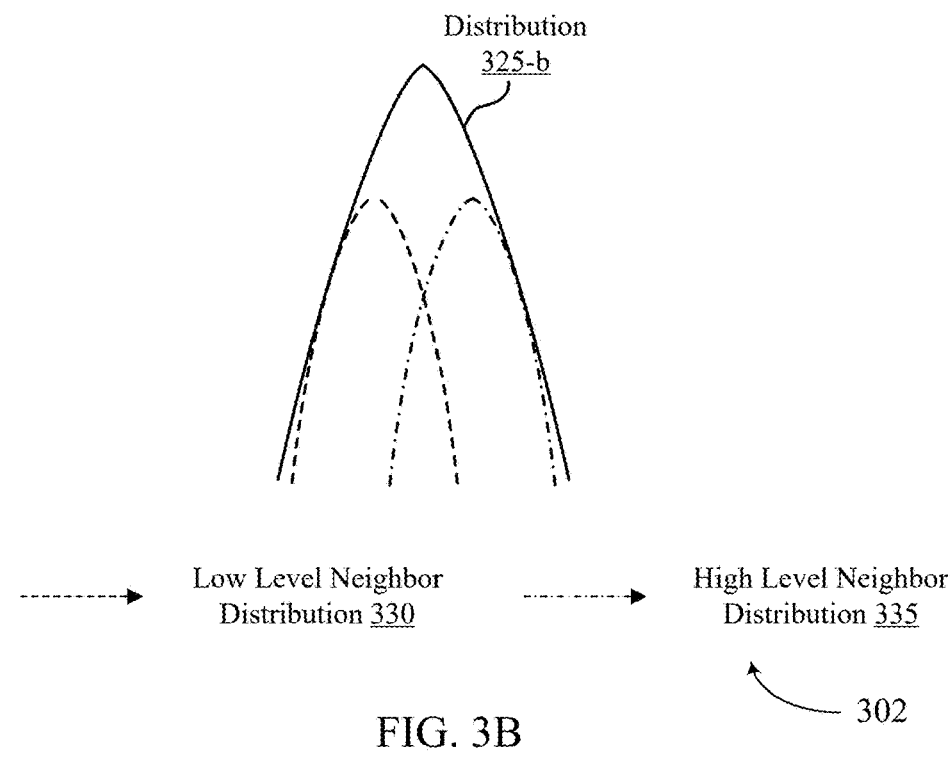

FIGS. 3A and 3B show examples of programming schemes 301 and 302 that support configurable program verify levels according to PECs at a memory system in accordance with examples as disclosed herein. The programming schemes 301 and 302 may implement, or be implemented by, one or more aspects of the memory device 100 and the memory architecture 200. For example, the programming scheme 301 illustrates an example of a controller 305 performing operations on one or more memory cells 310 (e.g., a memory cell 310-a and a memory cell 310-b), which may be examples of corresponding aspects described with reference to FIGS. 1 and 2. In some cases, the programming scheme 301 may support the controller 305 performing respective programming operations 315 on the memory cells 310. For example, the controller 305 may perform a programming operation 315-a on the memory cell 310-a, which may include a program verify operation 320 (e.g., as part of the programming operation 315-a). In some implementations as described herein, a program verify voltage applied to a memory cell 310-a as part of the program verify operation 320 may be based on a PEC count of the memory cell 310-a. Additionally, or alternatively, the programming scheme 302 may illustrate potential distributions of voltage thresholds at a memory cell 310 according to states of neighboring memory cells.

With reference to the programming scheme 301 illustrated by FIG. 3A, the controller 305 may be operable to program one or more word lines of memory cells 310 within a memory array. For example, the controller 305 may perform the programming operation 315-a to program a first set of memory cells 310 included in a first word line (e.g., a word line including the memory cell 310-a) and may perform the programming operation 315-b to program a second set of memory cells 310 included in a second word line (e.g., a word line including the memory cell 310-b). In some examples, the first word line and the second word line may be physically proximate to one another, for example vertically adjacent within a 3D memory array. For example, the memory cell 310-a and the memory cell 310-b may be located at the same position within a respective word line (e.g., the memory cell 310-b may be a 'neighbor' cell to the memory cell 310-a).

The controller 305 may apply, as part of the programming operation 315-a, one or more programming voltages to the memory cell 310-a to program the memory cell 310-a to a first state (e.g., a logic state). For example, the memory cell 310-a may support storing one of multiple logic states (e.g., the memory cell 310-a may support 7 logic states when the memory cell 310-a is a TLC), where each logic state may correspond to a charge level of the memory cell 310-a and may convey multiple bits of information. In some examples, programming the memory cell 310-a may result in the memory cell 310-a having a distribution 325-a, which may indicate a range of threshold voltages (e.g., read voltages) that, when applied to the memory cell 310-a, result in an output of a value (e.g., a count, a sequence of bits) corresponding to the logic state.

Additionally, as part of the programming operation 315-a, the controller 305 may perform a program verify operation 320 on the memory cell 310-a, which may include the controller 305 applying one or more program verify pulses to the memory cell 310-a in between one or more programming pulses. In some cases, the program verify pulses may include the controller 305 first applying a pre-program verify pulse that is below an expected threshold voltage of the memory cell 310-a (e.g., below the distribution 325-a, to ensure the memory cell does not store a lower state than intended) followed by applying a program verify pulse that is within the expected threshold voltage distribution of the memory cell 310-a (e.g., within a portion of the distribution 325-a, to verify the memory cell 310-a is programmed to the correct state). In some cases, the controller 305 may iteratively apply programming pulses and program verify pulses to the memory cells 310 of the first word line (e.g., including the memory cell 310-a) until the memory cell 310-a stores an intended logic state.

As an example, the controller 305 may apply a first programming pulse to the memory cells 310 of the first word line and may apply, after the first programming pulse, a first set of program verify pulses to the memory cells 310 of the first word line. In some cases, the first set of program verify pulses may include a first program verify pulse associated with a first state of the memory cells 310 (e.g., the first program verify pulse may verify approximately ⅛th of the memory cells programmed to level 1) and a second program verify pulse associated with a second state of the memory cells 310 (e.g., the second program verify pulse may verify approximately ⅛th of the memory cells programmed to level 2). The controller 305 may further apply a second programming pulse to unverified memory cells 310 of the first word line (e.g., memory cells 310 intended to be programmed to a higher state) and may apply a second set of program verify pulses to the unverified memory cells 310 to verify a second set of states (e.g., verifying level 3 and 4 memory cells 310). The controller 305 may continue applying programming pulses and program verify pulses to verify each respective level of the memory cells 310 of the first word line (e.g., verifying levels 1 through 8 of a word line of TLCs). In some examples, the controller 305 may apply a corrective program verify offset value according to a state of a neighbor cell, as described in greater detail with reference to FIG. 3B.

In some cases, due to the proximity of the memory cell 310-a and the memory cell 310-b, performing the programming operation 315-b on the memory cell 310-b after performing the programming operation 315-a the memory cell 310-a may influence a charge at the memory cell 310-a (e.g., a cell-to-cell (C2C) coupling effect). For example, the controller 305 may apply, to the memory cell 310-b as part of the programming operation 315-b (e.g., after the programming operation 315-a), a programming voltage to program the memory cell 310-b to a second state (e.g., a state of the multiple states supported by the memory cell 310-*a* and the memory cell 310-*b*, which may be the same or different as the first state), which may result in a charge state distribution of the memory cell 310-*a* being shifted. As illustrated by the programming scheme 301, the programming operation 315-*a* may program the memory cell 310-*a* to a first state having the distribution 325-*a* and the programming operation 315-*b* may result in the distribution 325-*a* shifting to a distribution 325-*b* (e.g., the charge in the memory cell 310-*a* may increase due to the C2C coupling after the programming operation 315-*b*).

FIG. 3B shows an example of a programming scheme 302 associated with a shifted distribution at a memory cell (e.g., the memory cell 310-*a*). For example, the programming scheme 302 may illustrate the distribution 325-*b* (e.g., a distribution shifted due to C2C coupling), as described with reference to FIG. 3A. In some examples, a magnitude of the shift between the distribution 325-*a* and the distribution 325-*b* may be affected by a relationship between the first state of the memory cell 310-*a* and the second state of the memory cell 310-*b*. For example, if the first state corresponds to a higher amount of stored charge than the second state (e.g., the memory cell 310-*b* is a low level neighbor), the memory cell 310-*a* may have a threshold voltage distribution similar to a low level neighbor distribution 330. That is, due to charge leakage, charge stored to the memory cell 310-*a* may flow towards the memory cell 310-*b* (e.g., according to electric equilibrium principles) based on the memory cell 310-*b* storing less charge, thereby shifting the threshold voltage distribution to a relatively lower voltage range. Alternatively, if the first state corresponds to a lower amount of stored charge than the second state (e.g., the memory cell 310-*b* is a high level neighbor), the memory cell 310-*a* may have a threshold voltage distribution similar to a high level neighbor distribution 335 (e.g., the memory cell 310-*a* may expect less or no charge leakage when the memory cell 310-*b* is a high level neighbor).

In some examples, the controller 305 may adjust a program verify voltage applied to the memory cell 310-*a* based on whether the memory cell 310-*b* is a high level neighbor or a low level neighbor. In some such examples, controller 305 may be aware of the second state that will be programmed to the memory cell 310-*b* prior to performing the programming operation 315-*b*. For example, the controller 305 may know a write pattern for the second word line including the memory cell 310-*b* when migrating data from an SLC-cache to TLC memory (e.g., flushing host data in an automotive application) or when writing sets of sequential data to the TLC memory. The controller 305 may leverage the knowledge of the second state that will be programmed to the memory cell 310-*b* to adjust the program verify voltage for the program verify operation 320, such as by applying a higher program verify voltage to the memory cell 310-*a* when the memory cell 310-*b* is a low level neighbor (e.g., increasing the stored charge to account for expected leakage), and vice versa. For example, if the memory cell 310-*a* receives a program verify pulse for verifying a certain level of the memory cell 310-*a*, the controller 305 may apply a program verify pulse having a higher magnitude if the memory cell 310-*a* is neighbored by a lower level cell than if the memory cell 310-*a* is neighbored by a higher level cell (e.g., to account for future charge leakage).

In some cases, additional factors may influence the charge stored to the memory cell 310-*a* (e.g., influencing the threshold voltage associated with outputting the stored logic state), such as a PEC count of the memory cell 310-*a*. For example, the PEC count of the memory cell 310-*a* may be associated a quantity of access operations performed on the memory cell 310-*a*, and a higher PEC count may be indicative greater wear-out at the memory cell 310-*a*. In some cases, the memory cell 310-*a* may experience greater charge leakage at higher PEC counts (e.g., vertical charge loss may be more prevalent at the end of life (EOL) for the memory cell 310-*a*). However, the controller 305 may not account for such factors when applying a corrective program verify voltage during the program verify operation 320, which reduce a RWB of the memory cell 310-*a* and reduce performance of subsequent read operations. As described herein, the controller 305 may adjust a magnitude of the program verify voltage (e.g., apply an offset to the program verify voltage) during the program verify operation 320 according to the PEC count of the memory cell 310-*a*, as described in greater detail with reference to FIG. 4. In some cases, by accounting for the PEC count of the memory cell 310-*a* when performing the programming operation 320, subsequent read operations and data storage capabilities of the memory cell 310-*a* may be improved.

Figure 4:
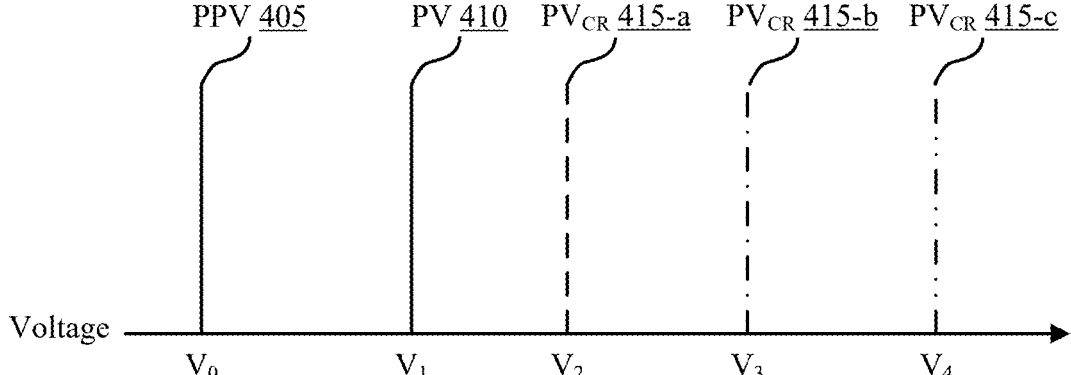
FIG. 4 shows an example of a program verify offset scheme that supports configurable program verify levels according to PECs at a memory system in accordance with examples as disclosed herein.

FIG. 4 shows an example of a program verify offset scheme 400 that supports configurable program verify levels according to PECs at a memory system in accordance with examples as disclosed herein. The program verify offset scheme 400 may implement, or be implemented by, one or more aspects of the memory device 100, the memory architecture 200, and the programming schemes 301 and 302. For example, the program verify offset scheme 400 illustrates one or more voltages that may be applied to a memory cell as part of a program verify operation, which may be examples of corresponding aspects described with reference to FIGS. 1 through 3B. In some cases, the program verify offset scheme may support the program verify voltage being offset based on a PEC count of a memory cell, which may improve a RWB of the memory cell.

In some cases, a controller (e.g., the controller 305 described with reference to FIGS. 3A and 3B) may perform a program verify operation on a memory cell to determine whether the memory cell stores an intended state. For example, the controller 305 may perform the program verify operation in between applying programming pulses to the memory cell to iteratively increase the charge stored to the memory cell until the memory cell outputs the intended state. The program verify operation may include the controller applying a pre-program verify (PPV) pulse 405 to the memory cell, which may be associated with a voltage $V_0$. The voltage $V_0$ may correspond to a voltage that is below an expected threshold voltage distribution for a state programmed to the memory cell, and applying the PPV pulse 405 may determine whether the memory cell is programmed to a lower state than intended (e.g., if the memory cell outputs a current in response to the PPV pulse 405). Additionally, or alternatively, the program verify operation may include the controller applying a program verify pulse 410, which may be associated with a voltage $V_1$. The voltage $V_1$ may correspond to a voltage that is within the expected voltage distribution for the state programmed to the memory cell such that the memory cell may be verified if the memory cell outputs a current in response to the program verify pulse 410.

Additionally, or alternatively, the controller may include one or more program verify offsets with the program verify pulse 410 to perform a corrective program verify operation. For example, as described with reference to FIG. 3B, the program verify pulse 410 may be adjusted according to a state of a neighbor memory cell (e.g., the program verify pules 410 may be increased if the neighbor memory cell is programmed to a lower state to account for future charge leakage effects). In some cases, the corrective program verify may further account for a PEC count of the memory cell. For example, due to charge leakage effects being less prevalent at relatively lower PEC counts, the controller may apply a corrective program verify pulse 415-$a$ to a memory cell having a PEC count below a first threshold (e.g., less than 1000 PECs, or any other suitable value). The corrective program verify pulse 415-$a$ may correspond to a voltage $V_2$, which may be the sum of the program verify pulse 410 and the program verify offset (e.g., the program verify offset may correspond to a difference between $V_2$ and $V_1$).

If the memory cell has a PEC count greater than the first threshold and less than a second threshold (e.g., greater than 1000 PECs and less than 2000 PECs, or any other suitable values), the controller may apply a corrective program verify pulse 415-$b$ to the memory cell. The corrective program verify pulse 415-$b$ may correspond to a voltage $V_3$ (e.g., the program verify offset may correspond to a difference between $V_3$ and $V_1$), which may be greater than the voltage $V_2$ to account for additional charge leakage effects associated with greater PEC counts. If the memory cell has a PEC count greater than the second threshold (e.g., greater than 2000 PECs, or any other suitable value), the controller may apply a corrective program verify pulse 415-$c$ to the memory cell. The corrective program verify pulse 415-$c$ may correspond to a voltage $V_4$ (e.g., the program verify offset may correspond to a difference between $V_4$ and $V_1$), which may be greater than the voltage $V_3$ to account for additional charge leakage effects associated with greater PEC counts. It should be noted that the controller may account for any quantity of threshold values or PEC ranges for adjusting the program verify offset during a corrective program verify operation, and is not limited to the example illustrated and described with reference to FIG. 4. Additionally, the program verify offset may be adjusted in view of one or both of a state of a neighbor cell and the PEC count of the memory cell (e.g., multiple program verify offsets may contribute to the final corrective program verify pulse 415 applied to a memory cell). By adjusting the program verify offset value according to the PEC count of the memory cell, the RWB of the memory cell may be improved, thereby improving subsequent read operations and data storage capabilities of the memory cell.

Figure 5:
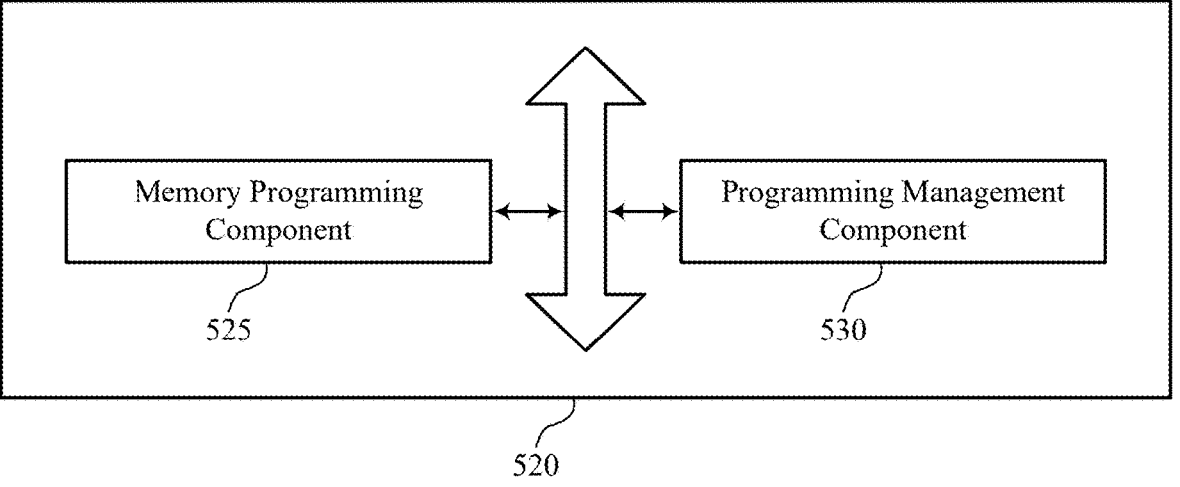
FIG. 5 shows a block diagram of a memory system that supports configurable program verify levels according to PECs at a memory system in accordance with examples as disclosed herein.

FIG. 5 shows a block diagram 500 of a memory system 520 that supports configurable program verify levels according to PECs at a memory system in accordance with examples as disclosed herein. The memory system 520 may be an example of aspects of a memory system as described with reference to FIGS. 1 through 4. The memory system 520, or various components thereof, may be an example of means for performing various aspects of configurable program verify levels according to PECs at a memory system as described herein. For example, the memory system 520 may include a memory programming component 525 a programming management component 530, or any combination thereof. Each of these components, or components of sub-components thereof (e.g., one or more processors, one or more memories), may communicate, directly or indirectly, with one another (e.g., via one or more buses).

The memory programming component 525 may be configured as or otherwise support a means for applying, to a first memory cell of a memory array of the memory system, a first voltage to program the first memory cell to a first state, where the first memory cell supports a plurality of states including the first state, and where each state of the plurality of states indicates a plurality of bits. In some examples, the memory programming component 525 may be configured as or otherwise support a means for applying, after applying the first voltage, a second voltage to the first memory cell to determine whether the first memory cell is programmed to the first state, where the second voltage is based at least in part on an expected threshold voltage associated with the first state and a program verify offset, and where a magnitude of the program verify offset is based at least in part on a quantity of PECs associated with the first memory cell. The programming management component 530 may be configured as or otherwise support a means for determining, based at least in part on the determination of whether the first memory cell is programmed to the first state, whether to apply a third voltage to the first memory cell to program the first memory cell to the first state.

In some examples, the programming management component 530 may be configured as or otherwise support a means for determining, based at least in part on applying the second voltage to the first memory cell, that the first memory cell is programmed to a second state of the plurality of states that is different from the first state. In some examples, the memory programming component 525 may be configured as or otherwise support a means for applying, based at least in part on the determination that the first memory cell is programmed to the second state, the third voltage to the first memory cell to program the first memory cell to the first state.

In some examples, the programming management component 530 may be configured as or otherwise support a means for determining, based at least in part on applying the second voltage to the first memory cell, that the first memory cell is programmed to the first state. In some examples, the memory programming component 525 may be configured as or otherwise support a means for refraining, based at least in part on the determination that the first memory cell is programmed to the first state, from applying the third voltage to the first memory cell.

In some examples, the memory programming component 525 may be configured as or otherwise support a means for applying, after applying the first voltage to the first memory cell, a fourth voltage to a second memory cell of the memory array to program the second memory cell to a second state from among the plurality of states, where the second voltage is based at least in part on a change in a charge associated with the first memory cell, the change in the charge based at least in part on applying the fourth voltage to the second memory cell, and where: the second voltage has a first magnitude when the second state corresponds to a lower voltage than the first state; and the second voltage has a second magnitude when the second state corresponds to a higher voltage than the first state, the first magnitude greater than the second magnitude.

In some examples, the program verify offset has a first magnitude when the quantity of PECs associated with the first memory cell is below a first threshold value; and the program verify offset has a second magnitude when the quantity of PECs associated with the first memory cell is greater than or equal to the first threshold value.

In some examples, the program verify offset has a third magnitude when the quantity of PECs associated with the first memory cell is greater than or equal to a second threshold value that is greater than the first threshold value, the third magnitude greater than the second magnitude.

In some examples, the second magnitude is greater than the first magnitude based at least in part on a rate of charge loss associated with the first memory cell being greater when the quantity of PECs associated with the first memory cell is greater the first threshold value than when the quantity of PECs associated with the first memory cell is less than the first threshold value.

In some examples, the memory array includes a plurality of memory cells, and each memory cell of the plurality of memory cells is an MLC, a TLC, or a QLC.

In some examples, the described functionality of the memory system 520, or various components thereof, may be supported by or may refer to at least a portion of at least one processor, where such at least one processor may include one or more processing elements (e.g., a controller, a microprocessor, a microcontroller, a digital signal processor, a state machine, discrete gate logic, discrete transistor logic, discrete hardware components, or any combination of one or more of such elements). In some examples, the described functionality of the memory system 520, or various components thereof, may be implemented at least in part by instructions (e.g., stored in memory, non-transitory computer-readable medium) executable by such at least one processor.

FIG. 6 shows a flowchart illustrating a method 600 that supports configurable program verify levels according to PECs at a memory system in accordance with examples as disclosed herein. The operations of method 600 may be implemented by a memory system or its components as described herein. For example, the operations of method 600 may be performed by a memory system as described with reference to FIGS. 1 through 5. In some examples, a memory system may execute a set of instructions to control the functional elements of the device to perform the described functions. Additionally, or alternatively, the memory system may perform aspects of the described functions using special-purpose hardware.

At 605, the method may include applying, to a first memory cell of a memory array of the memory system, a first voltage to program the first memory cell to a first state, where the first memory cell supports a plurality of states including the first state, and where each state of the plurality of states indicates a plurality of bits. In some examples, aspects of the operations of 605 may be performed by a memory programming component 525 as described with reference to FIG. 5.

At 610, the method may include applying, after applying the first voltage, a second voltage to the first memory cell to determine whether the first memory cell is programmed to the first state, where the second voltage is based at least in part on an expected threshold voltage associated with the first state and a program verify offset, and where a magnitude of the program verify offset is based at least in part on a quantity of PECs associated with the first memory cell. In some examples, aspects of the operations of 610 may be performed by a memory programming component 525 as described with reference to FIG. 5.

At 615, the method may include determining, based at least in part on the determination of whether the first memory cell is programmed to the first state, whether to apply a third voltage to the first memory cell to program the first memory cell to the first state. In some examples, aspects of the operations of 615 may be performed by a programming management component 530 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for applying, to a first memory cell of a memory array of the memory system, a first voltage to program the first memory cell to a first state, where the first memory cell supports a plurality of states including the first state, and where each state of the plurality of states indicates a plurality of bits; applying, after applying the first voltage, a second voltage to the first memory cell to determine whether the first memory cell is programmed to the first state, where the second voltage is based at least in part on an expected threshold voltage associated with the first state and a program verify offset, and where a magnitude of the program verify offset is based at least in part on a quantity of PECs associated with the first memory cell; and determining, based at least in part on the determination of whether the first memory cell is programmed to the first state, whether to apply a third voltage to the first memory cell to program the first memory cell to the first state.

Aspect 2: The method, apparatus, or non-transitory computer-readable medium of aspect 1, further including operations, features, circuitry, logic, means, or instructions, or any combination thereof for determining, based at least in part on applying the second voltage to the first memory cell, that the first memory cell is programmed to a second state of the plurality of states that is different from the first state and applying, based at least in part on the determination that the first memory cell is programmed to the second state, the third voltage to the first memory cell to program the first memory cell to the first state.

Aspect 3: The method, apparatus, or non-transitory computer-readable medium of any of aspects 1 through 2, further including operations, features, circuitry, logic, means, or instructions, or any combination thereof for determining, based at least in part on applying the second voltage to the first memory cell, that the first memory cell is programmed to the first state and refraining, based at least in part on the determination that the first memory cell is programmed to the first state, from applying the third voltage to the first memory cell.

Aspect 4: The method, apparatus, or non-transitory computer-readable medium of any of aspects 1 through 3, further including operations, features, circuitry, logic, means, or instructions, or any combination thereof for applying, after applying the first voltage to the first memory cell, a fourth voltage to a second memory cell of the memory array to program the second memory cell to a second state from among the plurality of states, where the second voltage is based at least in part on a change in a charge associated with the first memory cell, the change in the charge based at least in part on applying the fourth voltage to the second memory cell, and where: the second voltage has a first magnitude when the second state corresponds to a lower voltage than the first state; and the second voltage has a second magnitude when the second state corresponds to a higher voltage than the first state, the first magnitude greater than the second magnitude.

Aspect 5: The method, apparatus, or non-transitory computer-readable medium of any of aspects 1 through 4, where the program verify offset has a first magnitude when the quantity of PECs associated with the first memory cell is below a first threshold value; and the program verify offset has a second magnitude when the quantity of PECs associated with the first memory cell is greater than or equal to the first threshold value.

Aspect 6: The method, apparatus, or non-transitory computer-readable medium of aspect 5, where the program verify offset has a third magnitude when the quantity of PECs associated with the first memory cell is greater than or equal to a second threshold value that is greater than the first threshold value, the third magnitude greater than the second magnitude.

Aspect 7: The method, apparatus, or non-transitory computer-readable medium of any of aspects 5 through 6, where the second magnitude is greater than the first magnitude based at least in part on a rate of charge loss associated with the first memory cell being greater when the quantity of PECs associated with the first memory cell is greater the first threshold value than when the quantity of PECs associated with the first memory cell is less than the first threshold value.

Aspect 8: The method, apparatus, or non-transitory computer-readable medium of any of aspects 1 through 7, where the memory array includes a plurality of memory cells, and each memory cell of the plurality of memory cells is a MLC, a TLC, or a QLC.

It should be noted that the described methods include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" (e.g., "electrically coupling") may refer to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorus, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processing system (e.g., one or more processors, one or more controllers, control circuitry processing circuitry, logic circuitry), firmware, or any combination thereof. If implemented in software executed by a processing system, the functions may be stored on or transmitted over as one or more instructions (e.g., code) on a computer-readable medium. Due to the nature of software, functions described herein can be implemented using software executed by a processing system, hardware, firmware, hardwiring, or combinations of any of these. Features implementing functions may be physically located at various positions, including being distributed such that portions of functions are implemented at different physical locations.

Illustrative blocks and modules described herein may be implemented or performed with one or more processors, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or other types of processors. A processor may also be implemented as at least one of one or more computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, including in the claims, the article "a" before a noun is open-ended and understood to refer to "at least one" of those nouns or "one or more" of those nouns.

Thus, the terms "a," "at least one," "one or more," "at least one of one or more" may be interchangeable. For example, if a claim recites "a component" that performs one or more functions, each of the individual functions may be performed by a single component or by any combination of multiple components. Thus, the term "a component" having characteristics or performing functions may refer to "at least one of one or more components" having a particular characteristic or performing a particular function. Subsequent reference to a component introduced with the article "a" using the terms "the" or "said" may refer to any or all of the one or more components. For example, a component introduced with the article "a" may be understood to mean "one or more components," and referring to "the component" subsequently in the claims may be understood to be equivalent to referring to "at least one of the one or more components." Similarly, subsequent reference to a component introduced as "one or more components" using the terms "the" or "said" may refer to any or all of the one or more components. For example, referring to "the one or more components" subsequently in the claims may be understood to be equivalent to referring to "at least one of the one or more components."

Computer-readable media includes both non-transitory computer storage media and communication media including any medium that facilitates transfer of a computer program from one place to another. A non-transitory storage medium may be any available medium, or combination of multiple media, which can be accessed by a computer. By way of example, and not limitation, non-transitory computer-readable media can comprise RAM, ROM, electrically erasable programmable read-only memory (EEPROM), optical disk storage, magnetic disk storage or other magnetic storage devices, or any other non-transitory medium or combination of media that can be used to carry or store desired program code means in the form of instructions or data structures and that can be accessed by a computer, or one or more processors.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory system, comprising:
one or more memory devices; and
processing circuitry coupled with the one or more memory devices and configured to cause the memory system to:
apply, to a first memory cell of a memory array of the memory system, a first voltage to program the first memory cell to a first state, wherein the first memory cell supports a plurality of states comprising the first state, and wherein each state of the plurality of states indicates a plurality of bits;
apply, after applying the first voltage, a second voltage to the first memory cell to determine whether the first memory cell is programmed to the first state, wherein the second voltage is based at least in part on an expected threshold voltage associated with the first state and a program verify offset, and wherein a magnitude of the program verify offset is based at least in part on a quantity of program-erase cycles associated with the first memory cell; and determine, based at least in part on the determination of whether the first memory cell is programmed to the first state, whether to apply a third voltage to the first memory cell to program the first memory cell to the first state.

2. The memory system of claim 1, wherein the processing circuitry is further configured to cause the memory system to:

determine, based at least in part on applying the second voltage to the first memory cell, that the first memory cell is programmed to a second state of the plurality of states that is different from the first state; and apply, based at least in part on the determination that the first memory cell is programmed to the second state, the third voltage to the first memory cell to program the first memory cell to the first state.

3. The memory system of claim 1, wherein the processing circuitry is further configured to cause the memory system to:

determine, based at least in part on applying the second voltage to the first memory cell, that the first memory cell is programmed to the first state; and refrain, based at least in part on the determination that the first memory cell is programmed to the first state, from applying the third voltage to the first memory cell.

4. The memory system of claim 1, wherein the processing circuitry is further configured to cause the memory system to:

apply, after applying the first voltage to the first memory cell, a fourth voltage to a second memory cell of the memory array to program the second memory cell to a second state from among the plurality of states, wherein the second voltage is based at least in part on a change in a charge associated with the first memory cell, the change in the charge based at least in part on applying the fourth voltage to the second memory cell, and wherein:

the second voltage has a first magnitude when the second state corresponds to a lower voltage than the first state; and the second voltage has a second magnitude when the second state corresponds to a higher voltage than the first state, the first magnitude greater than the second magnitude.

5. The memory system of claim 1, wherein:

the program verify offset has a first magnitude when the quantity of program-erase cycles associated with the first memory cell is below a first threshold value; and the program verify offset has a second magnitude when the quantity of program-erase cycles associated with the first memory cell is greater than or equal to the first threshold value.

6. The memory system of claim 5, wherein the program verify offset has a third magnitude when the quantity of program-erase cycles associated with the first memory cell is greater than or equal to a second threshold value that is greater than the first threshold value, the third magnitude greater than the second magnitude.

7. The memory system of claim 5, wherein the second magnitude is greater than the first magnitude based at least in part on a rate of charge loss associated with the first memory cell being greater when the quantity of program-erase cycles associated with the first memory cell is greater the first threshold value than when the quantity of program-erase cycles associated with the first memory cell is less than the first threshold value.

8. The memory system of claim 1, wherein the memory array comprises a plurality of memory cells, each memory cell of the plurality of memory cells comprising a multiple-level cell (MLC), a tri-level cell (TLC), or a quad-level cell (QLC).

9. A method by a memory system, comprising:

applying, to a first memory cell of a memory array of the memory system, a first voltage to program the first memory cell to a first state, wherein the first memory cell supports a plurality of states comprising the first state, and wherein each state of the plurality of states indicates a plurality of bits;

applying, after applying the first voltage, a second voltage to the first memory cell to determine whether the first memory cell is programmed to the first state, wherein the second voltage is based at least in part on an expected threshold voltage associated with the first state and a program verify offset, and wherein a magnitude of the program verify offset is based at least in part on a quantity of program-erase cycles associated with the first memory cell; and determining, based at least in part on the determination of whether the first memory cell is programmed to the first state, whether to apply a third voltage to the first memory cell to program the first memory cell to the first state.

10. The method of claim 9, further comprising:

determining, based at least in part on applying the second voltage to the first memory cell, that the first memory cell is programmed to a second state of the plurality of states that is different from the first state; and applying, based at least in part on the determination that the first memory cell is programmed to the second state, the third voltage to the first memory cell to program the first memory cell to the first state.

11. The method of claim 9, further comprising:

determining, based at least in part on applying the second voltage to the first memory cell, that the first memory cell is programmed to the first state; and refraining, based at least in part on the determination that the first memory cell is programmed to the first state, from applying the third voltage to the first memory cell.

12. The method of claim 9, further comprising:

applying, after applying the first voltage to the first memory cell, a fourth voltage to a second memory cell of the memory array to program the second memory cell to a second state from among the plurality of states, wherein the second voltage is based at least in part on a change in a charge associated with the first memory cell, the change in the charge based at least in part on applying the fourth voltage to the second memory cell, and wherein:

the second voltage has a first magnitude when the second state corresponds to a lower voltage than the first state; and the second voltage has a second magnitude when the second state corresponds to a higher voltage than the first state, the first magnitude greater than the second magnitude.

13. The method of claim 9, wherein:

the program verify offset has a first magnitude when the quantity of program-erase cycles associated with the first memory cell is below a first threshold value; and the program verify offset has a second magnitude when the quantity of program-erase cycles associated with the first memory cell is greater than or equal to the first threshold value.

14. The method of claim 13, wherein the program verify offset has a third magnitude when the quantity of program-erase cycles associated with the first memory cell is greater than or equal to a second threshold value that is greater than the first threshold value, the third magnitude greater than the second magnitude.

15. The method of claim 13, wherein the second magnitude is greater than the first magnitude based at least in part on a rate of charge loss associated with the first memory cell being greater when the quantity of program-erase cycles associated with the first memory cell is greater the first threshold value than when the quantity of program-erase cycles associated with the first memory cell is less than the first threshold value.

16. The method of claim 9, wherein the memory array comprises a plurality of memory cells, each memory cell of the plurality of memory cells comprising a multiple-level cell (MLC), a tri-level cell (TLC), or a quad-level cell (QLC).

17. A non-transitory computer-readable medium storing code comprising instructions which, when executed by processing circuitry of a memory system, cause the memory system to:

apply, to a first memory cell of a memory array of the memory system, a first voltage to program the first memory cell to a first state, wherein the first memory cell supports a plurality of states comprising the first state, and wherein each state of the plurality of states indicates a plurality of bits;

apply, after applying the first voltage, a second voltage to the first memory cell to determine whether the first memory cell is programmed to the first state, wherein the second voltage is based at least in part on an expected threshold voltage associated with the first state and a program verify offset, and wherein a magnitude of the program verify offset is based at least in part on a quantity of program-erase cycles associated with the first memory cell; and determine, based at least in part on the determination of whether the first memory cell is programmed to the first state, whether to apply a third voltage to the first memory cell to program the first memory cell to the first state.

18. The non-transitory computer-readable medium of claim 17, wherein the instructions, when executed by the processing circuitry of the memory system, further cause the memory system to:

determine, based at least in part on applying the second voltage to the first memory cell, that the first memory cell is programmed to a second state of the plurality of states that is different from the first state; and apply, based at least in part on the determination that the first memory cell is programmed to the second state, the third voltage to the first memory cell to program the first memory cell to the first state.

19. The non-transitory computer-readable medium of claim 17, wherein the instructions, when executed by the processing circuitry of the memory system, further cause the memory system to:

determine, based at least in part on applying the second voltage to the first memory cell, that the first memory cell is programmed to the first state; and refrain, based at least in part on the determination that the first memory cell is programmed to the first state, from applying the third voltage to the first memory cell.

20. The non-transitory computer-readable medium of claim 17, wherein the instructions, when executed by the processing circuitry of the memory system, further cause the memory system to:

apply, after applying the first voltage to the first memory cell, a fourth voltage to a second memory cell of the memory array to program the second memory cell to a second state from among the plurality of states, wherein the second voltage is based at least in part on a change in a charge associated with the first memory cell, the change in the charge based at least in part on applying the fourth voltage to the second memory cell, and wherein:

the second voltage has a first magnitude when the second state corresponds to a lower voltage than the first state; and the second voltage has a second magnitude when the second state corresponds to a higher voltage than the first state, the first magnitude greater than the second magnitude.

21. The non-transitory computer-readable medium of claim 17, wherein:

the program verify offset has a first magnitude when the quantity of program-erase cycles associated with the first memory cell is below a first threshold value; and the program verify offset has a second magnitude when the quantity of program-erase cycles associated with the first memory cell is greater than or equal to the first threshold value.

22. The non-transitory computer-readable medium of claim 21, wherein the program verify offset has a third magnitude when the quantity of program-erase cycles associated with the first memory cell is greater than or equal to a second threshold value that is greater than the first threshold value, the third magnitude greater than the second magnitude.

23. The non-transitory computer-readable medium of claim 21, wherein the second magnitude is greater than the first magnitude based at least in part on a rate of charge loss associated with the first memory cell being greater when the quantity of program-erase cycles associated with the first memory cell is greater the first threshold value than when the quantity of program-erase cycles associated with the first memory cell is less than the first threshold value.

24. The non-transitory computer-readable medium of claim 17, wherein the memory array comprises a plurality of memory cells, each memory cell of the plurality of memory cells comprising a multiple-level cell (MLC), a tri-level cell (TLC), or a quad-level cell (QLC).

* * * * *